(12) United States Patent
Suzuki (10) Patent No.: US 7,234,413 B2
(45) Date of Patent: Jun. 26, 2007

(54) PLASMA PROCESSING APPARATUS

(75) Inventor: Masayasu Suzuki, Hadano (JP)

(73) Assignee: Shimadzu Corporation, Kyoto-shi (JP)

( * ) Notice: Subject to any disclaimer, the term of this patent is extended or adjusted under 35 U.S.C. 154(b) by 202 days.

(21) Appl. No.: 10/768,469

(22) Filed: Jan. 30, 2004

(65) Prior Publication Data

US 2004/0221816 A1 Nov. 11, 2004

(30) Foreign Application Priority Data

Jan. 31, 2003 (JP) ............................ 2003-024596

(51) Int. Cl.
*C23C 16/00* (2006.01)
*C23F 1/00* (2006.01)
*H01L 21/306* (2006.01)

(52) U.S. Cl. .................. 118/723 MW; 156/345.36; 156/345.41; 156/345.42; 156/345.46; 156/345.49

(58) Field of Classification Search .......... 156/345.36, 156/345.41; 118/723 MW
See application file for complete search history.

(56) References Cited

U.S. PATENT DOCUMENTS

| | | | | |
|---|---|---|---|---|
| 5,074,985 A | * | 12/1991 | Tamura et al. ......... | 204/298.11 |
| 5,134,965 A | * | 8/1992 | Tokuda et al. ...... | 118/723 MW |
| 5,861,601 A | * | 1/1999 | Sato et al. ............. | 219/121.43 |
| 6,059,922 A | * | 5/2000 | Yamazaki et al. ..... | 156/345.37 |
| 6,076,484 A | * | 6/2000 | Matsumoto et al. | 118/723 MW |
| 6,607,633 B2 | * | 8/2003 | Noguchi ................ | 156/345.41 |
| 6,796,268 B2 | * | 9/2004 | Ishii .................... | 118/723 MW |
| 6,911,617 B2 | * | 6/2005 | Ishii et al. ............. | 219/121.36 |

FOREIGN PATENT DOCUMENTS

| | | |
|---|---|---|
| JP | 2000-348898 | 12/2000 |
| JP | 2002-329716 | 11/2005 |

* cited by examiner

*Primary Examiner*—Parviz Hassanzadeh
*Assistant Examiner*—Rakesh Dhingra
(74) *Attorney, Agent, or Firm*—Rankin, Hill, Porter & Clark LLP (57) ABSTRACT

In a plasma processing apparatus, microwaves being transmitted in a waveguide pass through a microwave transmitted window via first and second slot antennas provided in a magnetic field side, so as to form surface waves. Process gas in a chamber is excited by the surface waves so as to generate surface wave plasma. A substrate is processed by the plasma. Each first slot antenna is provided with an aperture, which has a curved or bent shape and whose longitudinal direction extends substantially to follow the lines of magnetic force of the microwaves. Each second slot antenna is provided with an aperture which has a rectangular shape.

6 Claims, 8 Drawing Sheets

SPECIFICATION OF SLOT ANTENNA 5a
(WHEN wh = 109.2mm)

| | max | min |
|---|---|---|
| A | 70mm | 30mm |
| B | 92mm | 17mm |
| C | 16mm | 5mm |
| D | 18mm | -50mm |

PLASMA PROCESSING APPARATUS

BACKGROUND OF THE INVENTION

1. Field of the Invention

The present invention relates to a plasma processing apparatus using surface wave plasma.

2. Description of the Related Art

Plasma technology has been heretofore often used in semiconductor manufacturing processes for coating, etching, ashing and so on. In addition, plasma technology has been also used for manufacturing solar cells, liquid crystal displays, plasma displays, etc. Recently, with increase in panel size or screen size, large-area plasma processing techniques have come to be essential. To that end, it is necessary to generate large-area and high-density plasma uniformly. If the plasma density is uniform, uniform plasma processing can be performed all over a surface of a substrate.

As a plasma processing apparatus capable of generating large-area and high-density plasma, an apparatus using surface wave plasma (SWP) is known (e.g., see Japanese Patent Laid-Open No. 2000-348898 (page 2, FIG. 1)). In this apparatus, microwaves being transmitted in a waveguide are introduced into a plasma generating chamber from a slot antenna through a dielectric window so that process gas in the plasma generating chamber is excited by surface waves generated at a surface of the dielectric window facing the plasma generating chamber. The surface waves are transmitted promptly on the plasma generating in chamber of the dielectric window so that a plasma area corresponding to the surface area of the dielectric window can be obtained easily. The dielectric window is manufactured out of a dielectric material.

In the related-art apparatus, it cannot be said that the surface wave energy is transmitted all over the surface of the dielectric window uniformly. Thus, the related-art apparatus is not satisfactory in terms of equalization of the plasma density distribution. This is caused by the fact that the shape of an aperture, layout or the like, of the slot antenna does not always conform to the electromagnetic filed distribution generated inside the microwave waveguide.

SUMMARY OF THE INVENTION

It is an object of the invention to provide a plasma processing apparatus in which the plasma area is large and the plasma density is distributed uniformly.

(1) According to the invention, there is provided a plasma processing apparatus in which microwaves being transmitted in a waveguide are guided to a microwave transmitted window through a slot antenna provided in a magnetic field side so as to generate surface waves, and process gas in a vacuum chamber is excited by the surface waves to thereby generate surface wave plasma, with which a substrate is processed. In the plasma processing apparatus, the slot antenna includes at least one first slot antenna provided with an aperture having a curved or bent shape and a longitudinal direction of the aperture extends substantially to follow lines of magnetic force of the microwaves. In the plasma processing apparatus, it is preferable that the waveguide has a rectangular shape for transmitting microwaves of standing wave at TE10 mode.

In the plasma processing apparatus, it is preferable that the slot antenna further includes at least one second slot antenna in the magnetic field side, the second slot antenna being provided with an aperture having a rectangular shape.

It is also preferable that at least two first slot antennas are provided at an interval corresponding to an integral multiple of $\lambda g/2$ when $\lambda g$ designates a wavelength in the waveguide of the microwaves.

It is preferable that the slot antenna comprises at least two slot antenna sets each including at least one of the first slot antenna and the second slot antenna, which are provided at an interval corresponding to an integral multiple of $\lambda g/2$ when $\lambda g$ designates a wavelength in the waveguide of the microwaves.

Further, it is preferable that a longitudinal direction of the aperture of the second slot antenna is made variable with respect to an axis parallel with a direction in which the microwaves are transmitted.

(2) According to the invention, there is provided a plasma processing apparatus in which microwaves being transmitted in a waveguide are guided to a microwave transmitted window through a slot antenna provided in a magnetic field side so as to generate surface waves, and process gas in a vacuum chamber is excited by the surface waves to thereby generate surface wave plasma, with which a substrate is processed. In the plasma processing apparatus, an adjustment member for consecutively changing an electric-field-direction distance of the microwaves is provided in the waveguide and along a direction in which the microwaves are transmitted.

It is preferable that the plasma processing apparatus further includes an adjustment unit for varying a degree with which the electric-field-direction distance is changed by the adjustment member.

DETAILED DESCRIPTION OF THE INVENTION

A plasma processing apparatus according to the invention will be described below with reference to the drawings.

(First Embodiment)

Figure 1A:
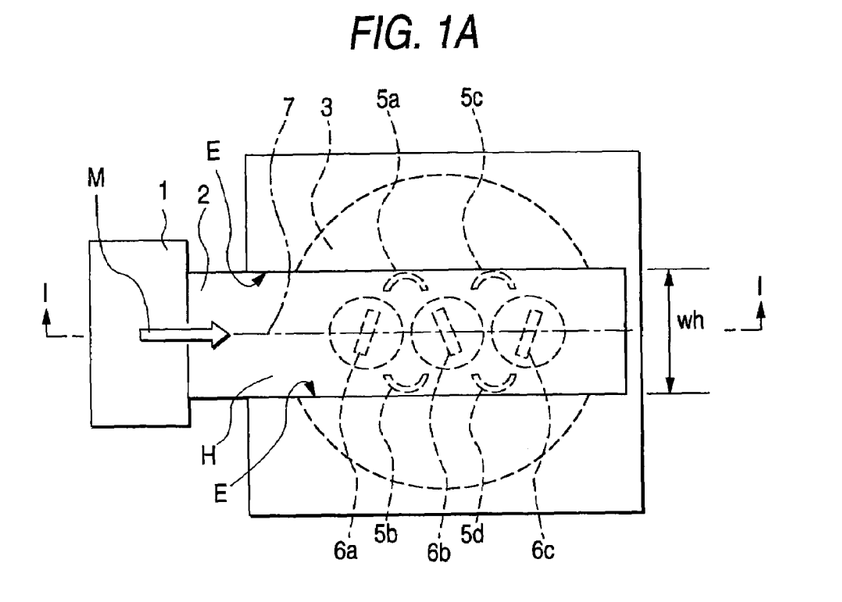
FIGS. 1A and 1B are schematic configuration views typically showing the whole of a plasma processing apparatus according to a first embodiment of the invention.
Figure 1B:
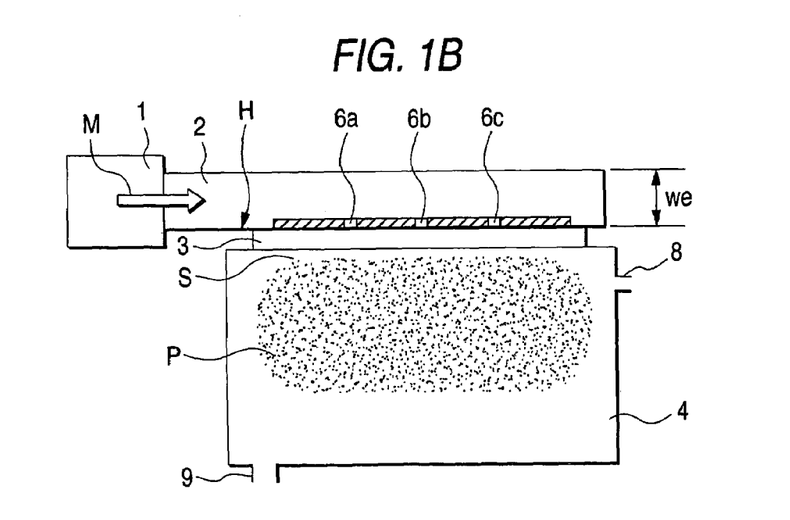
Figure 2A:
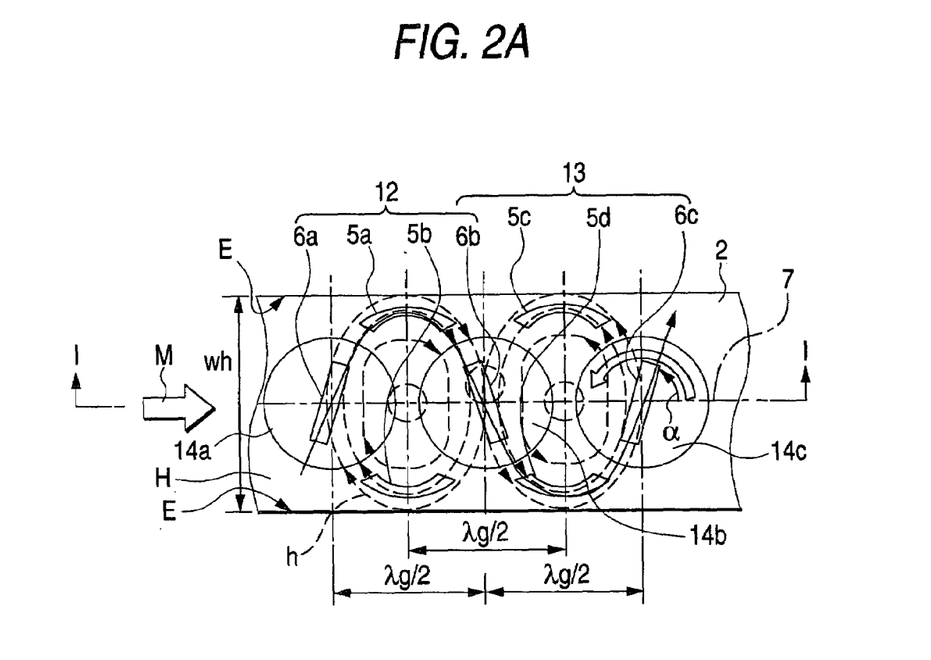
FIGS. 2A and 2B are schematic diagrams showing shapes of apertures and layouts of slot antennas and the electromagnetic field distribution in the plasma processing apparatus according to the first embodiment of the invention.
Figure 2B:
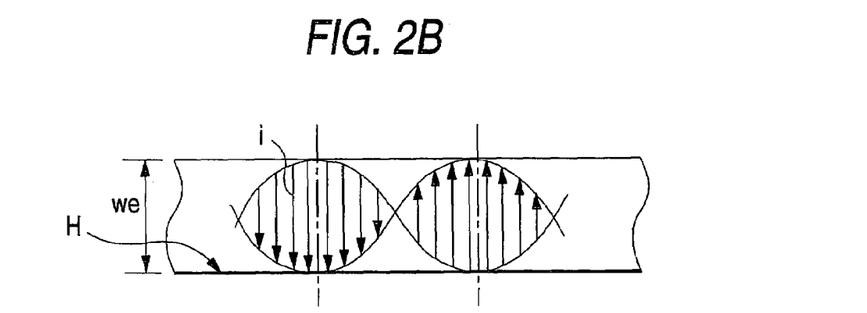
Figure 3:
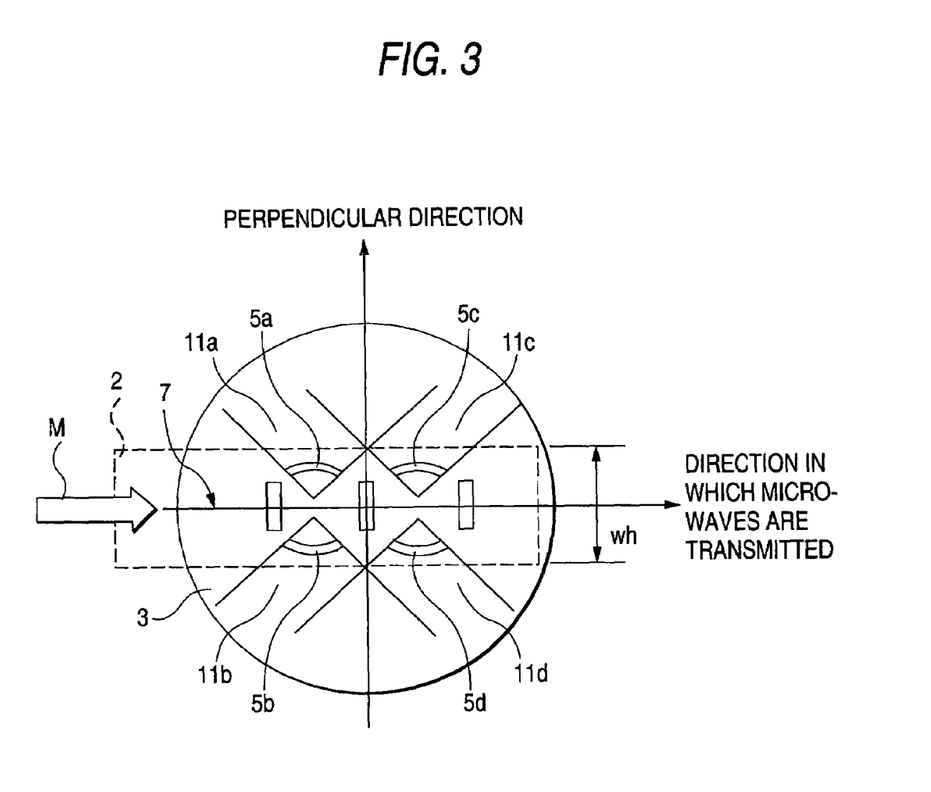
FIG. 3 is a partial top view showing the state where microwave energy is transmitted in the plasma processing apparatus according to the first embodiment of the invention.

FIGS. 1A and 1B are schematic configuration views typically showing the whole of a plasma processing apparatus according to a first embodiment of the invention. FIG. 1A is a top view, and FIG. 1B is a sectional view taken on line I—I in FIG. 1A. FIGS. 2A and 2B are schematic diagrams showing shapes of apertures and layouts of slot antennas and the electromagnetic field distribution in a microwave waveguide in the plasma processing apparatus according to the first embodiment of the invention. FIG. 2A is a top view, and FIG. 2B is a sectional view taken on line I—I in FIG. 2A. FIG. 3 is a partial top view showing the state where microwave energy is transmitted in the plasma processing apparatus according to the first embodiment of the invention.

The plasma processing apparatus shown in FIGS. 1A and 1B has a microwave output portion 1, a microwave waveguide 2, a dielectric window 3 and a chamber 4. The microwave output portion 1 has a high-voltage power supply and a microwave oscillator, for example, generating microwaves M at a frequency of about 2.45 GHz. The microwaves M are electromagnetic waves, which is transmitted in the microwave waveguide 2 and forms standing waves. In a bottom surface H (hereinafter referred to as "magnetic field side") of the microwave waveguide 2, slot antennas 5a–5d (first slot antennas) and 6a–6c (second slot antennas) for guiding the microwaves M to the dielectric window 3 are formed. As will be described later, the slot antennas 6a–6c are formed in discs 14a–14c respectively (see FIG. 2A) In this embodiment, each slot antenna 5a–5d is provided with an aperture having an arc shape that is convex on a side surface E (hereinafter, referred to as "electric field side") side of the microwave waveguide 2. The details of the slot antennas 5a–5d will be described later with reference to FIGS. 5A and 5B. The slot antennas 5a–5b and the slot antennas 5c–5d are disposed oppositely with respect to a central axis 7 in the center between two electric field sides E on the magnetic filed side H, respectively. In addition, each slot antenna 6a–6c is provided with an aperture having a rectangular shape, and the slot antennas 6a–6c are disposed along the central axis 7 in that order.

The microwaves M being transmitted in the microwave waveguide 2 passes through the dielectric window 3 via the slot antennas 5a–5d and 6a–6c. Then, the microwaves M is transmitted on a surface of the dielectric window 3 facing the chamber 4 as surface waves S and radiate into the chamber 4. The dielectric window 3 is the dielectric manufactured out of a dielectric material such as quartz, alumina, zirconia, or Pyrex glass (registered trademark).

The surface waves S are transmitted on the chamber 4 side surface of the dielectric window 3 instantaneously. Plasma P is generated by the energy of the surface waves, and the plasma area is expanded as the surface waves are transmitted. As a result, plasma whose area is proportional to the surface area of the dielectric window 3 can be generated.

The chamber 4 is provided with a gas introduction port 8 and an evacuation port 9. Process gas such as $O_2$, $SiH_4$, $H_2$, $N_2$, $SF_6$, $Cl_2$, Ar or He is introduced from the gas introduction port 8. While being introduced into the chamber 4, the process gas is discharged from the evacuation port 9. Thus, the pressure in the chamber 4 is normally kept at about 0.1–50 Pa. In such a pressure-reduced atmosphere, the process gas is excited by the surface wave energy so that the plasma P is generated. Though not shown, a substrate is placed in the plasma P, and processing such as coating, etching or ashing is performed on the substrate.

Here, the electromagnetic field distribution in the microwave waveguide 2 will be described with reference to FIGS. 2A and 2B. The microwave waveguide 2 measures 109.2 mm in width wh in the magnetic field side H and 54.6 mm in width we in the electric field side E. The microwave waveguide 2 has a rectangular shape with a length required for stabilizing standing wave at a TE10 mode as standing wave transmission mode (see FIGS. 1A and 1B). In FIG. 2A, the magnetic field distribution in the microwave waveguide 2 is shown by a plurality of lines h of magnetic force (shown by the broken lines). In FIG. 2B, the electric field distribution is shown by a plurality of currents i (shown by the solid lines). The lines h of magnetic force cross the currents i at right angles.

As described previously, the slot antennas 5a–5d and 6a–6c are provided in the magnetic field side H of the microwave waveguide 2. Generally, microwave power can be extracted from a slot antenna most efficiently when the slot antenna is provided with an aperture whose longitudinal direction follows the lines of magnetic force. As shown in FIG. 2A, each slot antenna 5a–5d is provided with the aperture whose longitudinal direction follows the lines h of magnetic force. Thus, the efficiency in extracting the microwave power is high.

In addition, each slot antenna 6a–6c is also disposed so that the longitudinal direction of the aperture thereof substantially follows the lines h of magnetic force.

FIG. 3 is a plan view conceptually showing an area where the surface wave energy is transmitted intensively.

The microwave power radiates efficiently in a direction perpendicular to the longitudinal direction of the aperture of each slot antenna. The radiated microwave power is transmitted on the surface of the dielectric window 3 as surface wave energy. Therefore, it is essential to suitably set the shape of the aperture or layout of each slot antenna which will be a port for extracting the microwave power therefrom.

With reference to FIG. 3, the transmitted state of the surface wave energy will be described in attention to the slot antennas 5a–5d with the arc-shaped apertures (hereinafter referred as arc-shaped slot antenna). A transmitted area 11a by the slot antenna 5a and a transmitted area 11c by the slot antenna 5c overlap each other more widely with increase of the distance from the central axis 7. In the same manner, a transmitted area 11b by the slot antenna 5b and a transmitted area 11d by the slot antenna 5d also overlap each other more widely with increase of the distance from the central axis 7. Thus, the surface waves spread all over the surface of the dielectric window 3 so as to expand the plasma area.

The surface wave energy diffuses concentrically with respect to the center of the arcs of the apertures of the slot antennas 5a–5d. Due to the surface waves overlapping each other, the energy density is not diminished so much even at a place remote from the central axis 7. Accordingly, the energy distribution also becomes uniform. The arc-shaped slot antennas 5a–5d contribute to equalization of the energy distribution in the perpendicular direction as well as to the surface wave energy which is transmitted with wide-range.

Again with reference to FIGS. 2A and 2B, description will be made on the layouts of the apertures of the slot antennas. A slot antenna set 12 is constituted by the slot antennas 5a and 5b and the slot antennas 6a and 6b. On the other hand, a slot antenna set 13 is constituted by the slot antennas 5c and 5*d* and the slot antennas 6*b* and 6*c*. The slot antenna 6*b* is shared between the slot antenna sets 12 and 13. The slot antennas 6*a*–6*c* disposed on the central axis 7 of the microwave waveguide 2 chiefly operate to transit the surface wave energy in the direction in which the microwaves are transmitted. Each slot antenna 6*a*–6*c* can extract the microwave power most intensively in the direction in which the microwaves are transmitted when the longitudinal direction of the aperture of the slot antenna 6*a*–6*c* is perpendicular to the direction in which the microwaves are transmitted.

In this embodiment, as shown in FIG. 2A, the distance between the slot antenna sets 12 and 13 is set at λg/2, where λg designates a wavelength in the waveguide of the microwaves. When the distance between the two sets is set at λkg/2, the distance conforms to the pitch with which the standing waves are formed in the microwave waveguide 2, so that the microwave power can be gathered efficiently.

Alternatively, the distance between the slot antenna sets 12 and 13 may be set at λg or 3λg/2.

In this embodiment, when the directions of the apertures of the slot antennas 6*a*–6*c* are made variable, the equalization of the energy distribution in the dielectric window 3 can be improved more greatly.

As shown in FIG. 2A, the slot antennas 6*a*, 6*b* and 6*c* are formed in discs 14*a*, 14*b* and 14*c* respectively so as to be identical to one another. The slot antenna 6*c* will be described representatively. For example, the aperture of the slot antenna 6*c* is formed by culling out a rectangular shape in a disc 14*c* of a nonmagnetic conductive material such as an aluminum alloy by electric discharge machining. The disc 14*c* with the slot antenna 6*c* is fitted to a bottom plate 15 (FIG. 4) with the magnetic field side H so that the disc 14*c* can rotate. The angle α of rotation can be varied manually or automatically in a range of from 0° to 180° with respect to the central axis 7 of the microwave waveguide 2. In the case where the angle of rotation of disc 14*c* is varied automatically, for example, a thin wire attached to the vicinity of the outer circumference of the disc is taken up by a motor. There Is no fear that such a configuration disturbs the standing wave transmission mode In the microwave waveguide 2.

Figure 4:
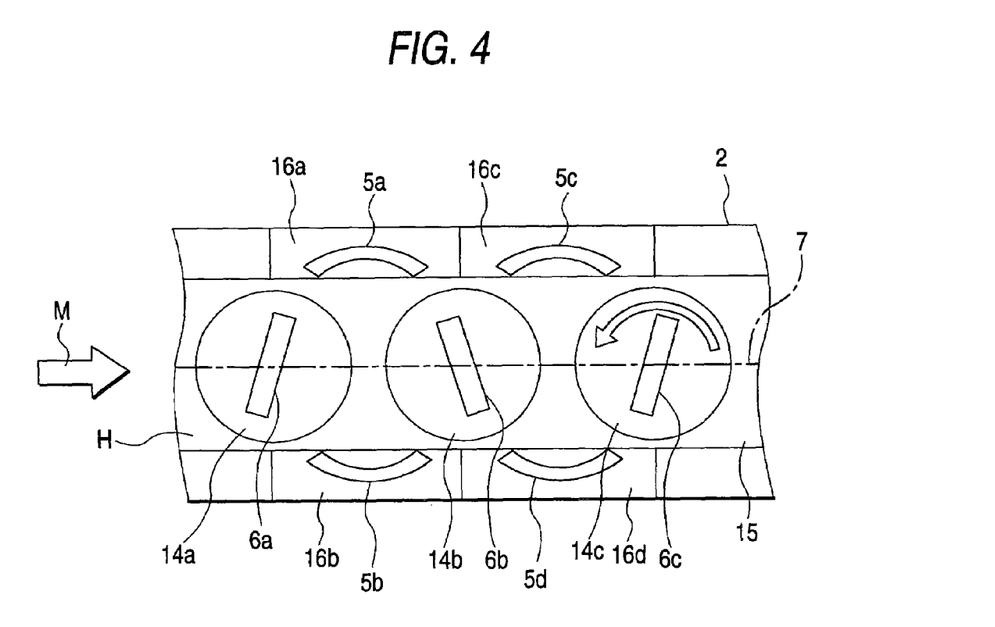
FIG. 4 is a partial top view showing shapes of apertures and layouts of slot antennas in the plasma processing apparatus according to a modification of the first embodiment.

FIG. 4 is a partial plan view showing the layouts of the slot antennas in the microwave waveguide according to a modification of this embodiment. As described previously, the discs 14*a*, 14*b* and 14*c* with the slot antennas 6*a*, 6*b* and 6*c* respectively are fitted to the bottom plate 15. The slot antennas 5*a*, 5*b*, 5*c* and 5*d* are formed in plates 16*a*, 16*b*, 16*c* and 16*d* respectively so as to be identical to one another. Since the plates 16*a*, 16*b*, 16*c* and 16*d* are placed simply on the opposite sides of the bottom plate 15, they can be attached and detached easily. Accordingly, when slot antennas having various shapes and dimensions are provided in plates in advance, the slot antennas can be exchanged easily in order to equalize the energy distribution in the dielectric window surface even if the microwave output, the pressure in the vacuum chamber, or the like, is changed. In addition, such plates can be used in combination with blank plates having no slot antenna formed therein. Incidentally, when the gap between each plate 16*a*–16*d* and the bottom plate 15 or the gap between adjacent ones of the plates is not longer than about 1 mm, there is no fear that the plates 16*a*–16*d* disturb the standing wave transmission mode in the microwave waveguide 2.

Figure 5A:
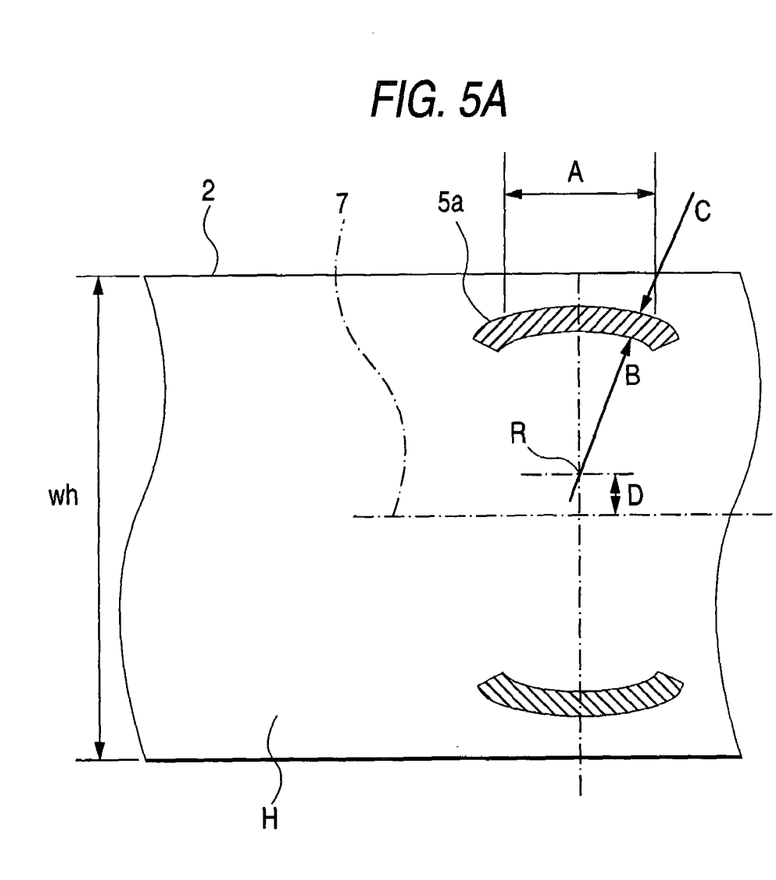
FIGS. 5A and 5B are a top view and a table showing a specific example about the shape, dimensions and position of the aperture of the slot antenna according to the first embodiment of the invention.
Figure 5B:
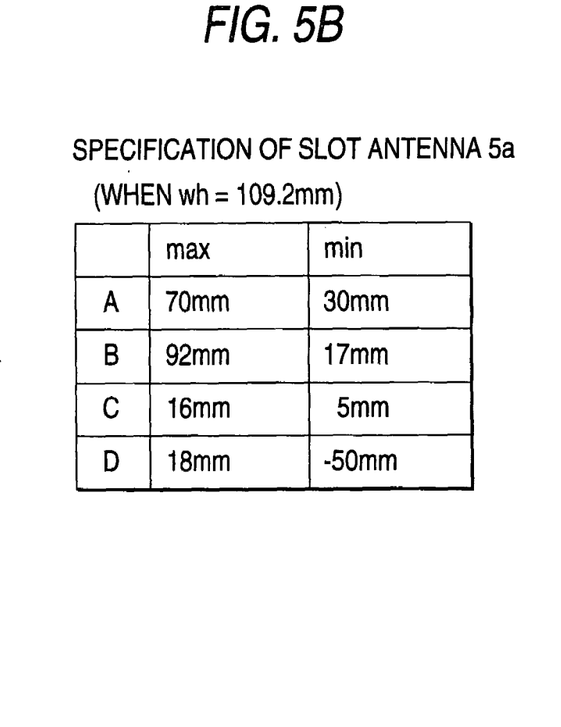

FIGS. 5A and 5B are diagrams showing a specific example about the shape, dimensions and position of a slot antenna. The slot antenna 5*a* will be described representatively. As shown in FIG. 5A, the reference sign A designates the length of the slot antenna 5*a*; B, the curvature radius when the slot antenna 5*a* is an arc; C, the width of the slot antenna 5*a*; and D, the distance of the curvature center R from the central axis 7. When the width wh of the magnetic field side H of the microwave waveguide 2 is 109.2 mm, each value A–D is in its corresponding range of from the value min to the value max, as shown in FIG. 5B.

Although description has been made in this embodiment on the assumption that each slot antenna 5*a*–5*d* (first slot antenna) is provided with an arc-shaped aperture, the invention is not limited thereto.

Figure 6A:
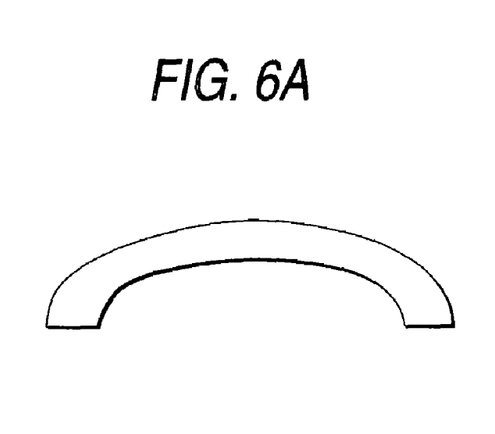
FIGS. 6A to 6C are schematic views showing other examples of shapes of apertures of slot antennas according to the first embodiment of the invention.
Figure 6B:
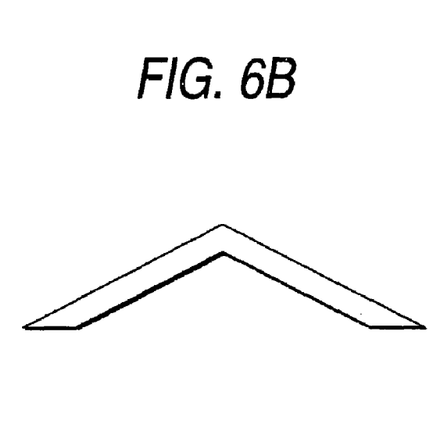
Figure 6C:
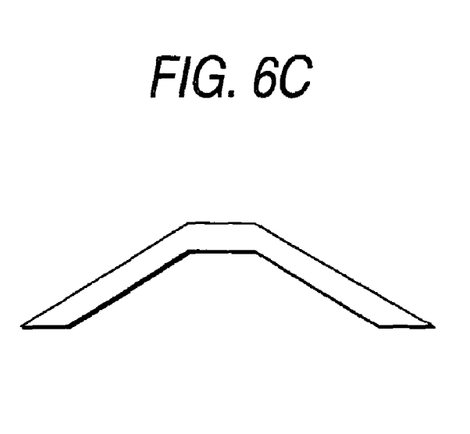

FIGS. 6A to 6C are schematic views showing other examples of shapes of apertures of first slot antennas. FIG. 6A shows an aperture with an arcuate shape flatter than a circular arc. FIG. 6B shows an aperture with a shape bent at one place near the center thereof. FIG. 6C shows an aperture with a shape similar to a trapezoid, bent at two places near the center thereof. In the aperture with the shape as shown in FIGS. 6A–6C of each first slot antenna, the longitudinal direction of the aperture is shaped to follow the lines of magnetic force of microwaves. Thus, each first slot antenna has operation and effect similar to those of the arc-shaped slot antennas 5*a*–5*d*.

Although this embodiment has been described on the case where four first slot antennas (slot antennas 5*a*–5*d*) are provided, the number of first slot antennas may be one. Further, although the direction of the aperture of each first slot antenna is convex with respect to the electric field side E in this embodiment, the direction is not limited thereto, but the aperture of the first slot antenna may have any direction if the longitudinal direction of the aperture of the first slot antenna follows the lines of magnetic forces of microwaves.

In the plasma processing apparatus according to this embodiment, the shapes of apertures or layouts of the slot antennas are set to conform to the electromagnetic field distribution generated in the microwave waveguide. Accordingly, not only is there a wide plasma area, but the plasma density distribution is also equalized.

In addition, when the directions of apertures of the second slot antennas are made variable, the operation of the first slot antennas is complemented so that the energy distribution in the surface of the dielectric window can be equalized more greatly. Thus, the plasma density distribution can be equalized.

(Second Embodiment)

Figure 7:
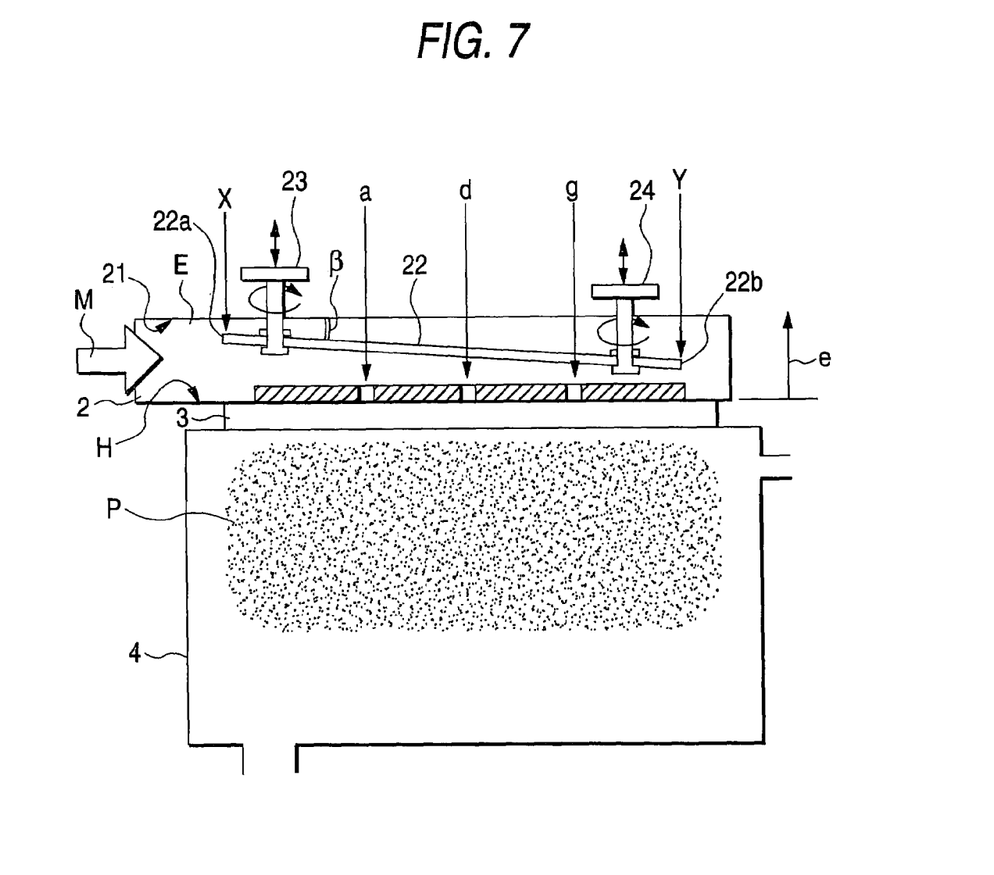
FIG. 7 is a schematic configuration view typically showing a plasma processing apparatus according to a second embodiment of the invention.

FIG. 7 is a schematic configuration view typically showing the whole of a plasma processing apparatus according to a second embodiment of the invention. The plasma processing apparatus according to this embodiment is adapted so that the electric-field-direction distance e of the microwave waveguide 2 varies continuously in the direction in which the microwaves M are transmitted. When the electric-field-direction distance e is varied, the excited state of plasma varies so that the plasma density can be equalized.

In order to vary the electric-field-direction distance e in the microwave waveguide 2, an adjustment member (flap plate) 22 is attached to a surface of the microwave waveguide 2 opposite to the magnetic field side H, that is, a top surface 21 of the microwave waveguide 2 as shown in FIG. 7. The flap plate 22 is machined out of a nonmagnetic conductive material such as an aluminum alloy, and attached to the top surface 21 at two places through adjustment knobs 23 and 24. The adjustment knobs 23 and 24 rotate independently of each other, so as to move the flap plate 22 vertically. As a result, the electric-field-direction distance e is changed so that the tilt angle β is also changed.

Next, description will be made on the relation among the attached position of the flap plate 22, the length of the flap plate 22 and the positions of the slot antennas. In the microwave waveguide 2, assume that the upstream side designates the entrance side of the microwaves M and the downstream side designates the terminal surface side. Assume that the slot antennas are provided at three places a, d and g ranging from the upstream side to the downstream side. The front end position X of the flap plate 22 can be selected arbitrarily if it is on the upstream side of the place g. On the other hand, the terminal end position Y of the flap plate 22 may be at any place if it is on the downstream side of the place g. Thus, the length of the flap plate 22 is defined by the front end position X and the terminal end position Y of the flap plate 22.

In this embodiment, regardless of the shapes of apertures and dimensions of the slot antennas, and number of the slot antennas, the front end position X of the flap plate 22 is on the upstream side of the most upstream slot antenna while the terminal end position Y of the flap plate 22 is on the downstream side of the most downstream slot antenna. Incidentally, it is desired that the width of the flap plate 22 is made substantially equal to the width of the magnetic field side H of the microwave waveguide 2. However, the width of the flap plate 22 may be narrower than the width of the magnetic field side H.

Figure 8A:
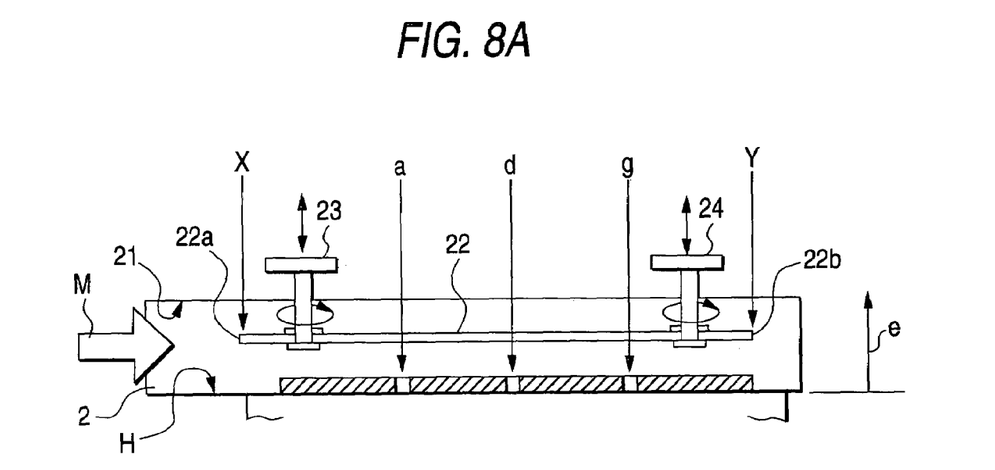
FIGS. 8A and 8B are partial sectional view typically showing the inside of a microwave waveguide of the plasma processing apparatus according to the second embodiment of the invention.
Figure 8B:
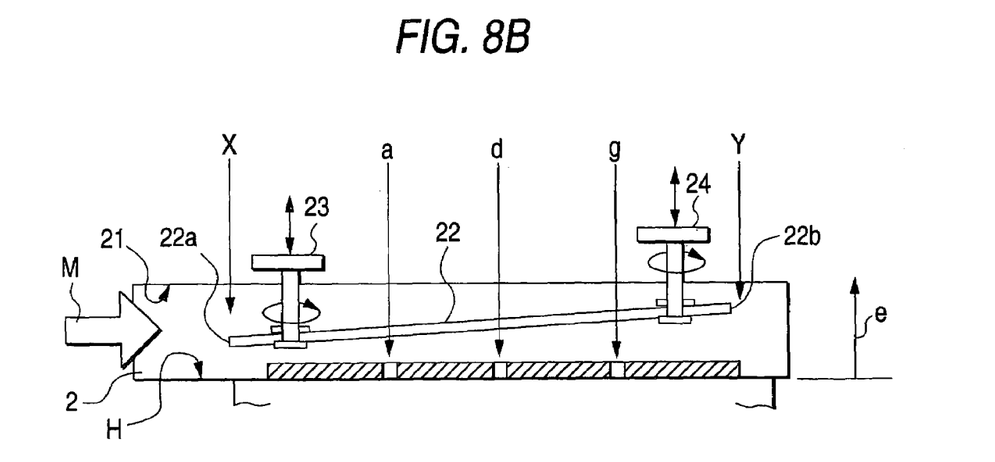

The tilt angle β of the flap plate 22 may be changed desirably till the front end 22a or the terminal end 22b thereof abuts against the magnetic field side H or the top surface 21. The electric-field-direction distance e is also changed in accordance with the tilt angle β. As a result, the degree of the tilt can be also changed. With reference to FIGS. 8A and 8B, this state will be described specifically.

FIGS. 8A and 8B are partial sectional view typically showing the inside of the microwave waveguide of the plasma processing apparatus according to the second embodiment of the invention. In FIG. 8A, the flap plate 22 is parallel with the magnetic field side H and the top surface 21, so that the tilt angle β is 0°. The electric-field-direction distance e can be selected arbitrarily. FIG. 8B shows the state where the flap plate 22 tilts in the opposite direction to that in FIG. 7. In this case, the electric-field-direction distance e increases from the upstream side of the microwave waveguide 2 to the downstream side thereof.

The rotating operation of the adjustment knobs 23 and 24 may be performed manually or automatically. To rotate the adjustment knobs 23 and 24 automatically, for example, the rotating shaft of each adjustment knob 23, 24 may be connected directly to the rotating shaft of a motor independently.

In the plasma processing apparatus according to this embodiment, the adjustment member is provided in the inner wall of the waveguide so that the electric-field-direction distance of the microwaves can be changed continuously to follow the direction in which the microwaves are transmitted. Accordingly, not only is there a wide plasma area, but the energy absorption ratio in each slot antenna is averaged so that the plasma density distribution is also equalized.

As described above, according to the invention, it is possible to provide plasma processing apparatus in which the plasma area is large, and the plasma density is distributed uniformly.

What is claimed is:

1. A plasma processing apparatus comprising:
a rectangular waveguide in which microwaves are transmitted;
a slot antenna provided in a magnetic field side;
a microwave transmitting window; and
a vacuum chamber into which process gas is introduced,
wherein the microwaves being transmitted in said rectangular waveguide form standing waves and pass through said microwave transmitting window via said slot antenna so as to generate surface waves, and the process gas in said vacuum chamber is excited by the surface waves to thereby generate surface wave plasma, with which a substrate is processed, and wherein said slot antenna includes at least one first slot antenna provided with an aperture having a curved or bent shape generally extending in a longitudinal direction of the rectangular waveguide and being positioned such that the aperture substantially follows lines of magnetic force of the microwaves.

2. The plasma processing apparatus according to claim 1, wherein said slot antenna further includes at least one second slot antenna provided with an aperture having a rectangular shape.

3. The plasma processing apparatus according to claim 1, wherein at least two said first slot antennas are provided at an interval corresponding to an integral multiple of λg/2 when λg designates a wavelength in said rectangular waveguide of said microwaves.

4. The plasma processing apparatus according to claim 2, wherein said slot antenna comprises at least two slot antenna sets each including at least one of said first slot antenna and said second slot antenna, which are provided at an interval corresponding to an integral multiple of λg/2 when λg designates a wavelength in said rectangular waveguide of said microwaves.

5. The plasma processing apparatus according to claim 2, wherein a longitudinal direction of the aperture of said second slot antenna is made variable with respect to an axis parallel with a direction in which the microwaves are transmitted.

6. The plasma processing apparatus according to claim 4, wherein a longitudinal direction of the aperture of said second slot antenna is made variable with respect to an axis parallel with a direction in which the microwaves are transmitted.

* * * * *